(12) United States Patent
Rhodes

(10) Patent No.: US 7,402,451 B2
(45) Date of Patent: Jul. 22, 2008

(54) OPTIMIZED TRANSISTOR FOR IMAGER DEVICE

(75) Inventor: Howard E. Rhodes, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 323 days.

(21) Appl. No.: 11/093,287

(22) Filed: Mar. 30, 2005

(65) Prior Publication Data

US 2005/0170545 A1    Aug. 4, 2005

Related U.S. Application Data

(62) Division of application No. 10/611,892, filed on Jul. 3, 2003, now Pat. No. 7,250,647.

(51) Int. Cl.
*H01L 21/00* (2006.01)

(52) U.S. Cl. .............. 438/60; 438/57; 438/59; 438/73; 438/75; 438/299; 438/301; 438/302; 438/303; 438/305; 438/306; 438/307

(58) Field of Classification Search .......... 438/57, 438/59, 60, 73, 75, 299, 301–303, 305–307
See application file for complete search history.

(56) References Cited

U.S. PATENT DOCUMENTS

| | | | |
|---|---|---|---|
| 5,780,902 A * | 7/1998 | Komuro ............... 257/344 |
| 5,783,458 A * | 7/1998 | Kadosh et al. ............ 438/305 |
| 6,140,630 A | 10/2000 | Rhodes |
| 6,166,405 A * | 12/2000 | Kuriyama et al. .......... 257/290 |
| 6,204,524 B1 | 3/2001 | Rhodes |
| 6,310,366 B1 | 10/2001 | Rhodes et al. |
| 6,326,652 B1 | 12/2001 | Rhodes |
| 6,333,205 B1 | 12/2001 | Rhodes |
| 6,376,868 B1 | 4/2002 | Rhodes |
| 6,521,926 B1 * | 2/2003 | Sasaki ............... 257/292 |
| 6,541,329 B1 * | 4/2003 | Chen et al. ............ 438/237 |

OTHER PUBLICATIONS

Micron; Pixel Structure, Active Pixel Architectures;http://www.micron.com/imaging/Technology/Pixel_Structure/index.html accessed Jul. 18, 2002.
The Manufacturing Process; Chapter 2; fm p. 33, Monday, Sep. 4, 2000.
LLD Implant; http://www.cyberfab.net/training/processflow/ldd_implant.html Accessed Jul. 30, 2002.

* cited by examiner

*Primary Examiner*—Zandra Smith
*Assistant Examiner*—Bac H Au
(74) *Attorney, Agent, or Firm*—Dickstein Shapiro LLP

(57) ABSTRACT

An imager device that has mitigated dark current leakage and punch-through protection. The transistor associated with the photoconversion device is formed with a single (i.e, one-sided) active area extension region on one side of the transistor gate opposite the photoconversion device, while other transistors can have normal symmetrical (i.e, two-sided) active area extension regions (e.g., lightly doped drains) with resulting high performance and short gate lengths. The asymmetrical active area extension region of the transistor associated with the photodiode can serve to reduce dark current at the photoconversion device. The punch-through problem normally cured by a lightly doped drain is fixed at the transistor associated with the photoconversion device by adding a $V_t$ adjustment implant and/or increasing its gate length.

29 Claims, 21 Drawing Sheets

OPTIMIZED TRANSISTOR FOR IMAGER DEVICE

This application is a divisional of U.S. patent application Ser. No. 10/611,892, filed Jul. 3, 2003, now U.S. Pat. No. 7,250,647, the entirety of which is hereby incorporated by reference.

FIELD OF THE INVENTION

This invention relates to imager devices and improvements to the circuitry of the photosensors thereof.

BACKGROUND OF THE INVENTION

A CMOS imager circuit includes a focal plane array of pixel cells, each one of the cells including a photoconversion device, for example, a photogate, photoconductor, or a photodiode for accumulating photo-generated charge in a portion of the substrate. A readout circuit is connected to each pixel cell and includes at least an output transistor, which receives photogenerated charges from a doped diffusion region (an electrically active area) and produces an output signal which is periodically read-out through a pixel access transistor. The imager may optionally include a transistor for transferring charge from the photoconversion device to the diffusion region or the diffusion region may be directly connected to or part of the photoconversion device. A transistor is also typically provided for resetting the diffusion region to a predetermined charge level before it receives the photoconverted charges.

A basic, three-transistor (3T) CMOS active pixel sensor (APS) design used in many applications contains a photodiode; a reset transistor, for resetting the photodiode voltage; a source follower transistor having a gate connected to the photodiode, for producing an output signal, and a row select transistor for selectively connecting the source follower to a column line of a pixel array. In a four-transistor (4T) configuration, a transfer transistor is employed to gate charges from the photodiode to the gate of the source follower transistor.

Exemplary CMOS imaging circuits, processing steps thereof, and detailed descriptions of the functions of various CMOS elements of an imaging circuit are described, for example, in U.S. Pat. No. 6,140,630 to Rhodes, U.S. Pat. No. 6,376,868 to Rhodes, U.S. Pat. No. 6,310,366 to Rhodes et al., U.S. Pat. No. 6,326,652 to Rhodes, U.S. Pat. No. 6,204,524 to Rhodes, and U.S. Pat. No. 6,333,205 to Rhodes. The disclosures of each of the forgoing are hereby incorporated by reference herein in their entirety.

The transistors of CMOS imager circuits are typically n-channel MOSFETs. In other semiconductor technology, e.g., DRAM technology, n-channel transistors typically have LDD (lightly doped drain) implants to improve off-state leakage and punch through leakage for short gate length devices. However, when this technique is used for transistors associated with photodiodes of CMOS imager circuits such as, transfer or reset transistors, a problem is presented. The LDD implant on the photodiode side of the transistor causes high electric fields to the substrate, which results in higher imager dark current.

This problem associated with CMOS imagers is dark current generation. Pixel cells of CMOS imagers are typically electrically isolated from one another by STI (shallow trench isolation) regions, where trenches are etched into the substrate and filled with a dielectric. An LDD-type implant in the photodiode region of the pixel increases the electric field in that region, resulting in increased photodiode leakage or increased dark current. Another physical source of dark current produced by such an LDD implant would be along the transistor gate associated with the photodiode as well.

CCD imagers also include signal output circuitry, which includes at least an output transistor, a reset transistor, a floating diffusion region, a Vcc voltage source, a source follower transistor and a voltage output. This circuitry can also suffer from dark current generation and current leakage, which results in poor device performance.

A method and apparatus which mitigates the leakage and dark current problems, but which still enables effective punch-through protection would be advantageous.

SUMMARY

This invention provides an imager device that has diminished dark current leakage to the substrate while maintaining transistor punch-through protection. A transistor associated with the photodiode of a pixel (e.g., a transfer transistor in a 4T pixel circuit or a reset transistor in a 3T pixel circuit) is formed with a single active area extension region, similar to a lightly doped drain (LDD) region, on only the side of the gate—opposite the photodiode—while other transistors of the pixel have normal two-sided, symmetrical active area extension regions with resulting high performance and short gate lengths. Similarly, a transistor associated with a floating diffusion region can have a single active area extension region opposite the floating diffusion region. The asymmetrical active area extension region of the transistor associated with the photodiode reduces leakage and dark current at the device. The asymmetrical active area extension region of the transistor associated with the floating diffusion region performs similarly. Punch-through problems at these transistors can be mitigated by having the single active area extension region on the high-voltage side of the gate (i.e., opposite the photodiode or floating diffusion region), by adding a $V_t$ adjustment implant, and/or by increasing gate length of that transistor relative to other transistors of the pixel. The one-sided active area extension regions are effective for CMOS and CCD imagers.

Additional advantages and features of the present invention will be apparent from the following detailed description and drawings which illustrate various embodiments of the invention.

DETAILED DESCRIPTION

Figure 1A:
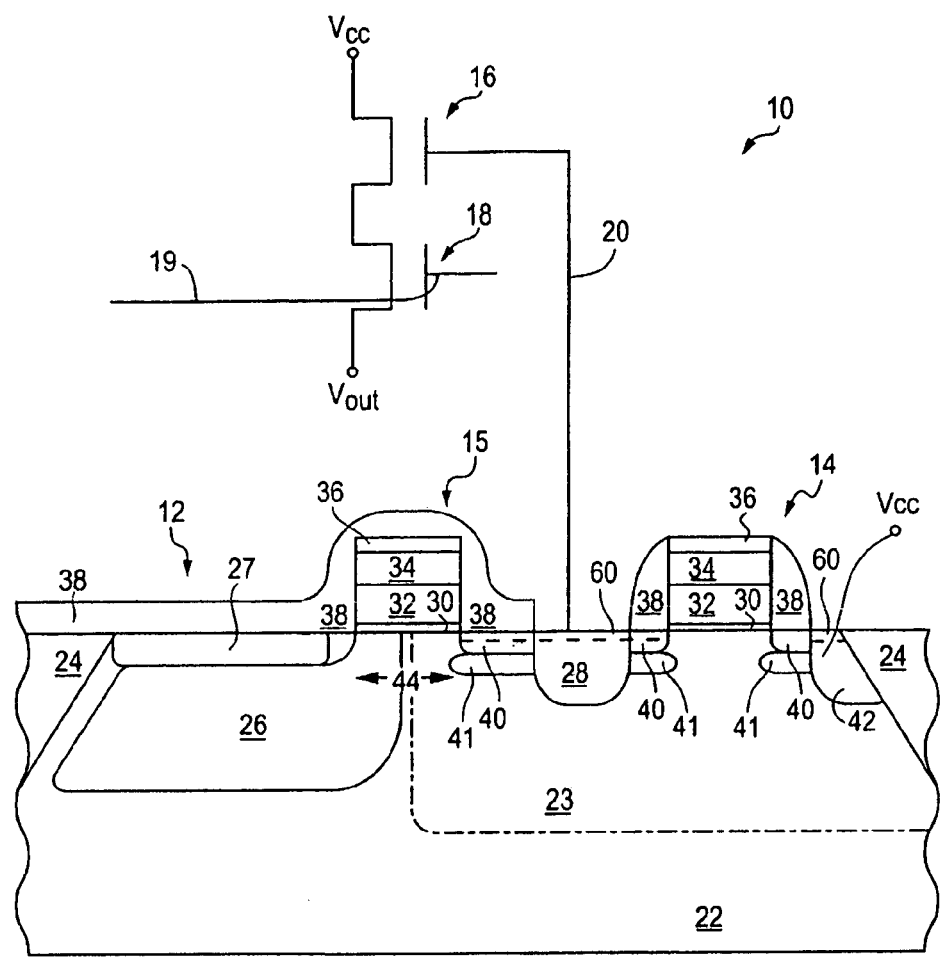
FIGS. 1(a), 1(b), and 1(c) are illustrations of 4T CMOS imager circuits in accordance with alternative embodiments of the invention.

This invention relates to an imager device that has diminished dark current and leakage to the substrate and retains punch-through protection. Suitable for any transistor arrangement associated with a photoconversion device of a CMOS imager pixel, e.g., a photodiode, the invention may be utilized in any pixel which has a transistor adjacent and associated with the photoconversion device or adjacent and associated with a floating diffusion region. The invention may also be utilized with a CCD image sensor.

The transistor associated with the photoconversion device (or floating diffusion region) is formed with only one active area extension region (i.e, one-sided), similar to a lightly doped drain (LDD) region, meaning that there is an active area extension region on only the side of the transistor gate—opposite the photoconversion device or floating diffusion region—without a matching active area extension region on the side adjacent the photoconversion device (or floating diffusion region, if appropriate). Other transistors of the pixel or other portions of a chip containing a pixel array can have typical symmetrical active area extension regions (e.g., LDD regions) with resulting high performance and short gate lengths or may have one-sided active area extension regions. The asymmetrical active area extension region of the transistor associated with the photodiode reduces pixel dark current and leakage. The asymmetrical active area extension region of the transistor associated with the floating diffusion region reduces dark current and leakage associated with the floating diffusion node. Punch-through problems at these transistors can be mitigated by having the one-sided active area extension region on the high-voltage side of the gate (i.e., opposite the photodiode or floating diffusion region), by adding a $V_t$ adjustment implant, and/or by increasing gate length of the transistor relative to other transistors of the pixel.

In the following detailed description, reference is made to the accompanying drawings, which form a part hereof, and in which is shown by way of illustration various embodiments of the invention. These embodiments are described in sufficient detail to enable those skilled in the art to practice the invention; however, it is to be understood that other embodiments may be utilized, and that structural, logical, and electrical changes may be made without departing from the spirit and scope of the present invention. Additionally, processing steps described and their progression are exemplary of preferred embodiments of the invention; however, the sequence of steps is not limited to that set forth herein and may be changed as is known in the art, with the exception of steps necessarily occurring in a certain order.

The terms "wafer" and "substrate" are to be understood to be interchangeable and as including silicon, silicon-on-insulator (SOI) or silicon-on-sapphire (SOS) technology, doped and undoped semiconductors, epitaxial layers of silicon supported by a base semiconductor foundation, and other semiconductor structures. Furthermore, when reference is made to a "wafer" or "substrate" in the following description, previous process steps may have been utilized to form regions, junctions or material layers in or on the base semiconductor structure or foundation. In addition, the semiconductor need not be silicon-based, but can be based on silicon-germanium, germanium, gallium arsenide, or other semiconductor materials.

The term "pixel" refers to a photo-element unit cell containing a photoconversion device for converting electromagnetic radiation to an electrical signal and transistors which operate the pixel and output the electrical signals to other devices. For purposes of illustration, a representative pixel is illustrated in the figures and description herein, and typically fabrication of all pixels in an imager will proceed simultaneously in a similar fashion. The following detailed description is not to be taken in a limiting sense, and the scope of the present invention is defined by the appended claims.

Figure 1B:
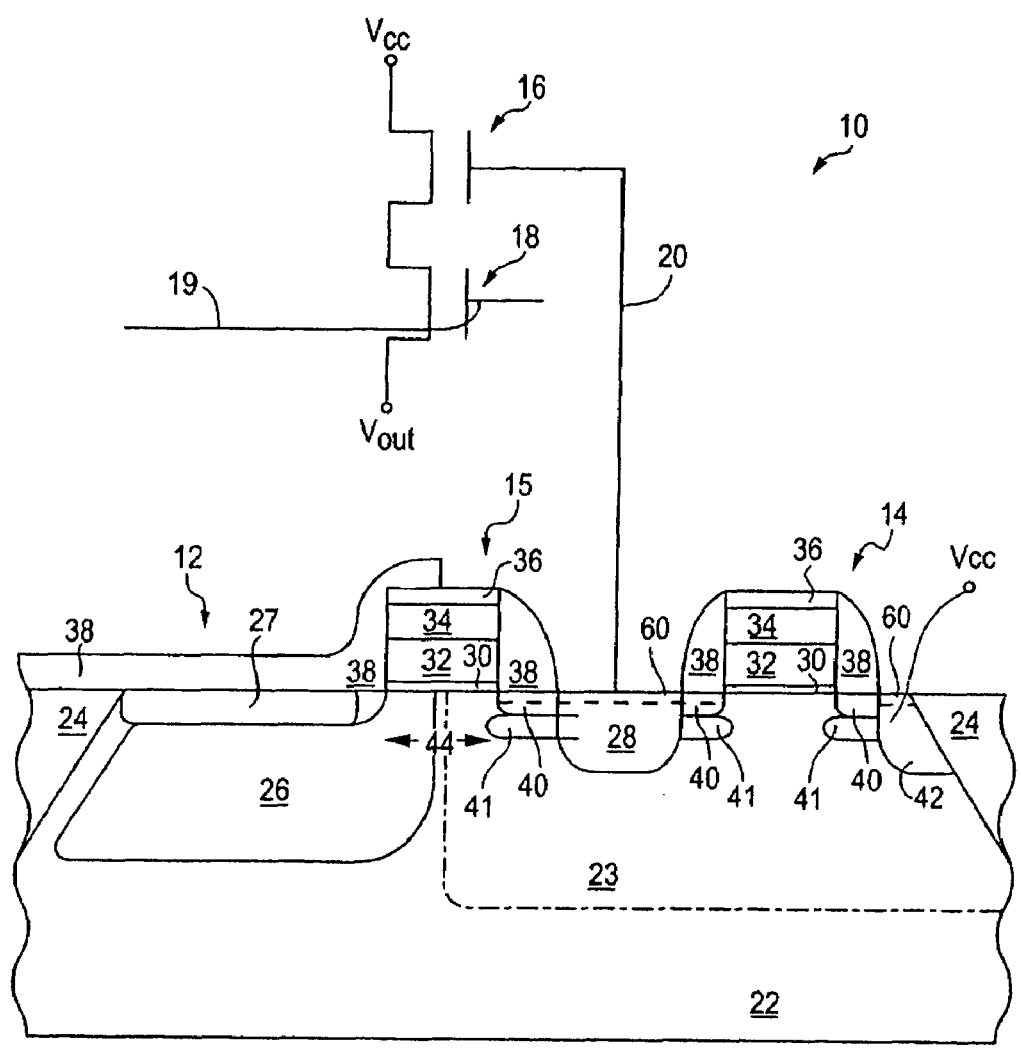
Figure 1C:
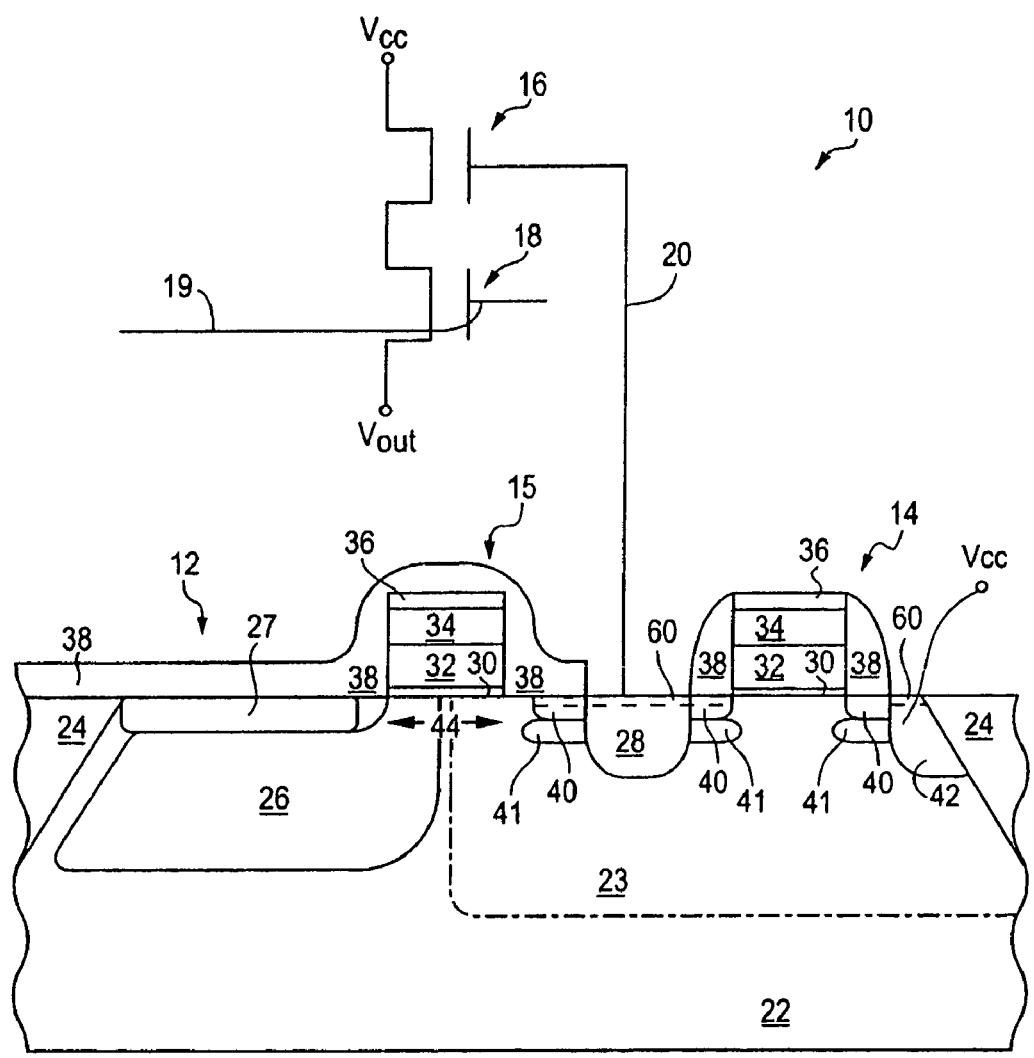

Now referring to the figures, where like reference numbers designate like elements, FIG. 1(a), FIG. 1(b), and FIG. 1(c) each show a simplified pixel 10 in accordance with three embodiments of the invention. The various FIG. 1 embodiments are four-transistor (4T) pixels using a photodiode 12 having an n-type region 26 and p-type region 27 thereover, forming a p-n junction at their interface.

Figure 2A:
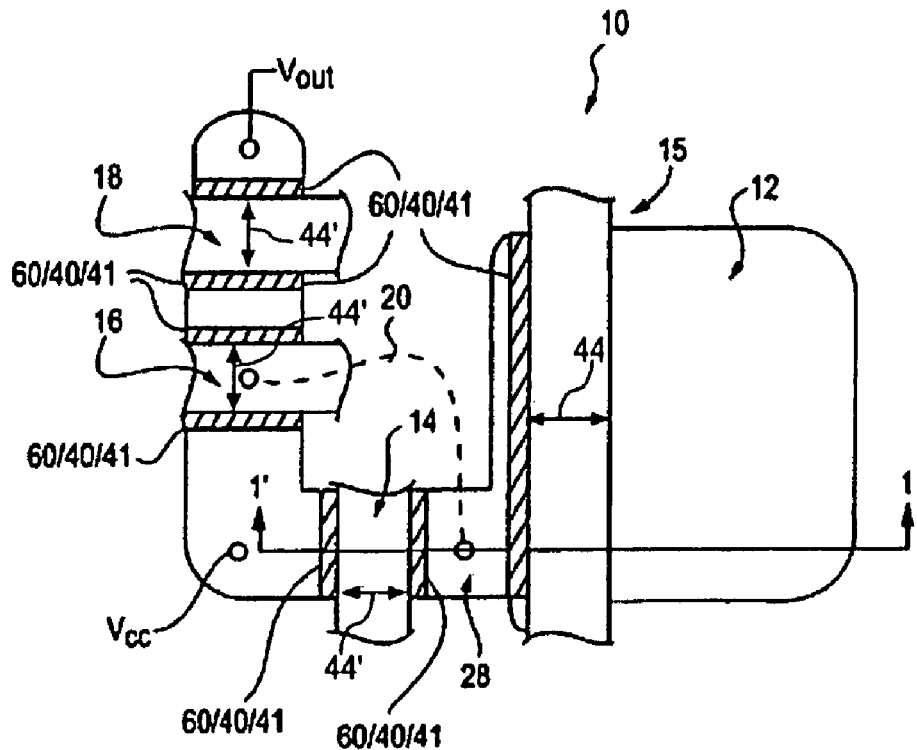
FIGS. 2(a) and 2(b) show alternative circuits as in FIGS. 1(a), 1(b), or 1(c), where the various FIG. 1 alternative cross-sections are shown through line 1-1'.
Figure 2B:
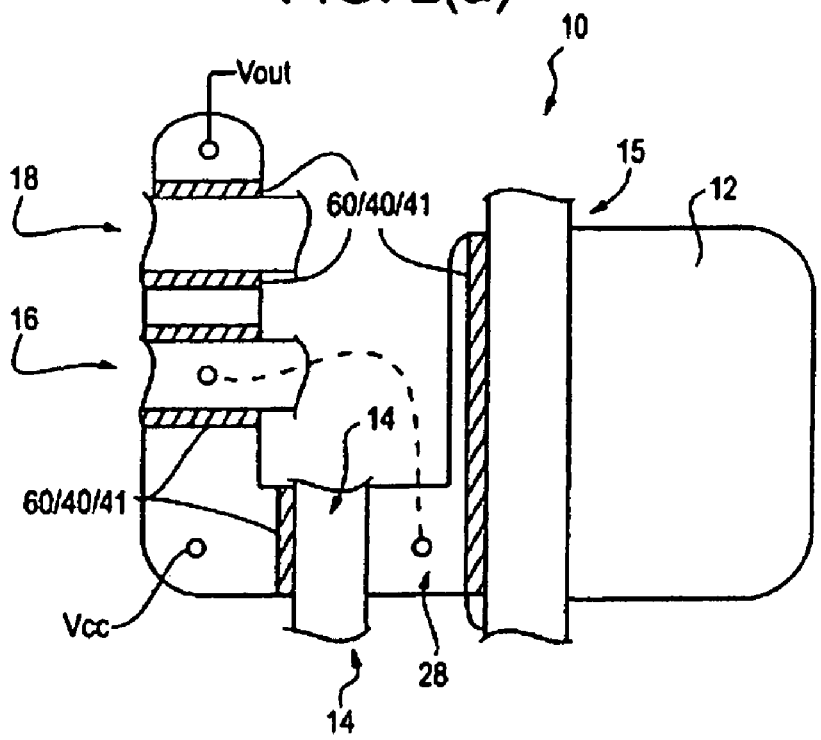

FIG. 2(a) shows the same a pixel 10 circuit (as shown in FIGS. 1(a), 1(b), and 1(c)) from above. The pixel 10 of FIG. 2(a) shows a one-sided active area extension region 40 at the transfer transistor 15 and two-sided active area extension regions 40 at the other transistors 14, 16, and 18, of the pixel 10. FIG. 2(a) also shows how the gate length 44 of the transfer transistor 15 can be greater relative to the gate lengths 44' of the other transistors of the pixel 10 in accordance with an embodiment of the invention, as further discussed below with reference to FIGS. 1(a), 1(b). and 1(c). FIG. 2(b) shows an alternative embodiment of the pixel 10 where not only the transfer transistor 15 has a one-sided active area extension region 40, but so do the reset transistor 14 and the source follower transistor 16.

It should be understood that, while FIGS. 1(a), 1(b), and 1(c) show the circuitry for operation of a single pixel 10, in practical use there will be an M×N array of pixels 10 arranged in rows and columns with the pixels 10 of the array accessed using row and column select circuitry, as known in the art.

The 4T CMOS pixel 10 shown in FIGS. 1(a), 1(b), and 1(c) includes a photodiode 12, a transfer transistor 15, a reset transistor 14, a source follower transistor 16, and a row select transistor 18. A p-well 23 is provided in the substrate 22. The transfer transistor 15 provides a gate for electrically linking the photodiode 12 to the other transistors 14, 16, 18 via a floating diffusion region 28, which is typically n-type. The floating diffusion region 28 is a heaviliy implanted source/drain region achieved with a high dose phosphorus or arsenic implant. As illustrated, the transfer transistor 15 has an asymmetrical active area extension region 40, which is typically n-type, being formed from at least one of a phosphorus, an arsenic, or an antimony implant. Associated with the active area extension regions 40 is a halo implant region 41, which is typically p-type, e.g., boron or indium, to provide added punch-through protection. Sharing the floating diffusion region 28 with the transfer transistor 15 is a reset transistor 14, which is connected to a voltage source ($V_{cc}$) at a source/drain region 42 for providing a resetting voltage to the floating diffusion region 28. The transfer transistor 15 can have an increased gate length 44 to mitigate the effects of the asymmetrical active area extension region 40 of the transfer transistor 15 to prevent punch-through.

The reset transistor 14 can have symmetrical active area extension (i.e., LDD) regions 40 as shown in FIG. 2. Alternatively, an asymmetrical active area extension region 40 can also be utilized with the reset transistor 14 at the floating diffusion region 28 as shown in FIG. 2(a). Eliminating the active area extension region 40 from the side of the reset transistor 14 adjacent the floating diffusion region 28 can reduce current leakage. In such an embodiment, the VcC side (at source/drain 42) of the reset transistor 14 has an active area extension region 40 implant while the floating diffusion region 28 does not. In general, the use of asymmetrical active area extension regions 40 may be incorporated into any other transistor (i.e., 16 and 18) in a pixel 10 circuit where either (1) a reduced $V_t$ device is desired or (2) a reduced leakage is desired on one side of the transistor.

There are, however, differences between the embodiments shown in FIG. 1(a), FIG. 1(b), and FIG. 1(c). In the embodiment of the invention shown by FIG. 1(a), the floating diffusion region 28 is spaced away from the transfer transistor 15 gate and located adjacent the reset transistor 14 gate. The single active area extension region 40 associated with the transfer transistor 15 extends the active area to the edge of the transfer transistor 15 gate. The halo implant region 41 associated with the active area extension region 40 extends under a portion of the transistor 15 gate. In the embodiment shown in FIG. 1(a), an insulating material 38 protects the transfer transistor 15 as a layer thereover, extending to the floating diffusion region 28 and over the photodiode 12. The insulating material 38 also protects the reset transistor 14 gate as insulating sidewall spacers.

The embodiment shown in FIG. 1(b) does not space the floating diffusion region 28 away from the transfer transistor 15 gate. During processing a mask position is shifted relative to the embodiment shown in FIG. 1(a) to both position the floating diffusion region 28 adjacent the transfer transistor 15 gate, as well as form a sidewall spacer of layer 38 on a side of that gate adjacent the floating diffusion region 28. The insulating material 38 extends from over part of the transfer transistor 15 gate and over the photodiode 12.

The embodiment shown in FIG. 1(c) spaces each of the floating diffusion region 28, the active area extension region 40, and the halo implant region 41 away from the transfer transistor 15 gate. Similar to FIG. 1(a), the insulating material 38 forms a layer over the transfer transistor 15 and extends to the floating diffusion region 28 and over the photodiode 12.

Figure 3:
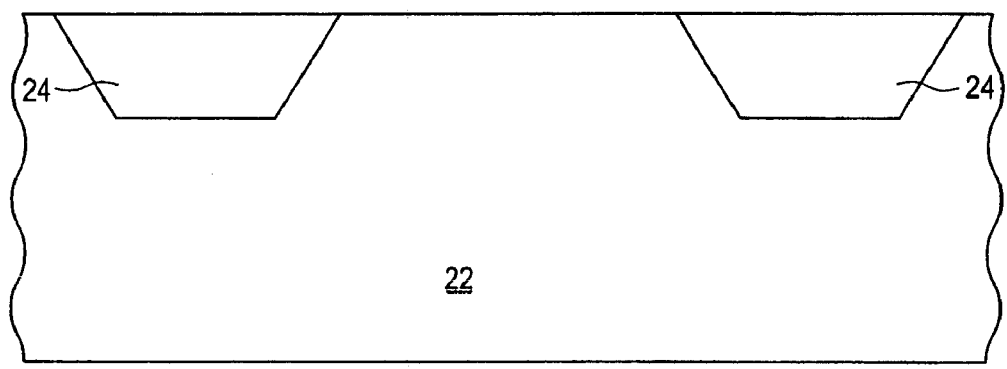
FIG. 3 shows a stage of fabrication of a pixel circuit in accordance with the invention.

Each pixel 10 of the various embodiments shown in FIGS. 1(a), 1(b), and 1(c), is isolated within the substrate 22 by isolation regions 24, which are preferably STI (shallow trench isolation) regions, but may also be FOX (field oxide) regions formed by LOCOS processing. FIG. 3 shows an initial stage of processing in accordance with the invention, commencing with the forming of STI isolation regions 24. In forming the STI isolation regions 24, a photoresist mask is formed, patterned and etched to leave openings where the isolation regions 24 are desired. Trenches of about 1,000 to about 4,000 Å in depth, preferably about 1,500-3,000 Å deep, with a width of about 500 Å to about 10,000 Å, preferably 1,000-3,000 Å, are formed in the substrate 22 by anisotropic etching. The photoresist mask is subsequently removed.

A layer of dielectric material (e.g., silicon dioxide, silicon nitride, oxide-nitride, nitride-oxide, or oxide-nitride-oxide, etc.) is deposited within the trenches by CVD, LPCVD, HDP, or other suitable means. Optionally, a thin insulating layer can be deposited before the main dielectric material forming the isolation regions 24. Also, optionally, the region of the substrate 22 just below the isolation region 24 can be doped by ion implantation. After filling the trenches with dielectric, the wafer is planarized, for example by CMP or RIE dry etching processes, and the isolation regions are complete as shown in FIG. 3 and surround the pixel 10 area.

Figure 4A:
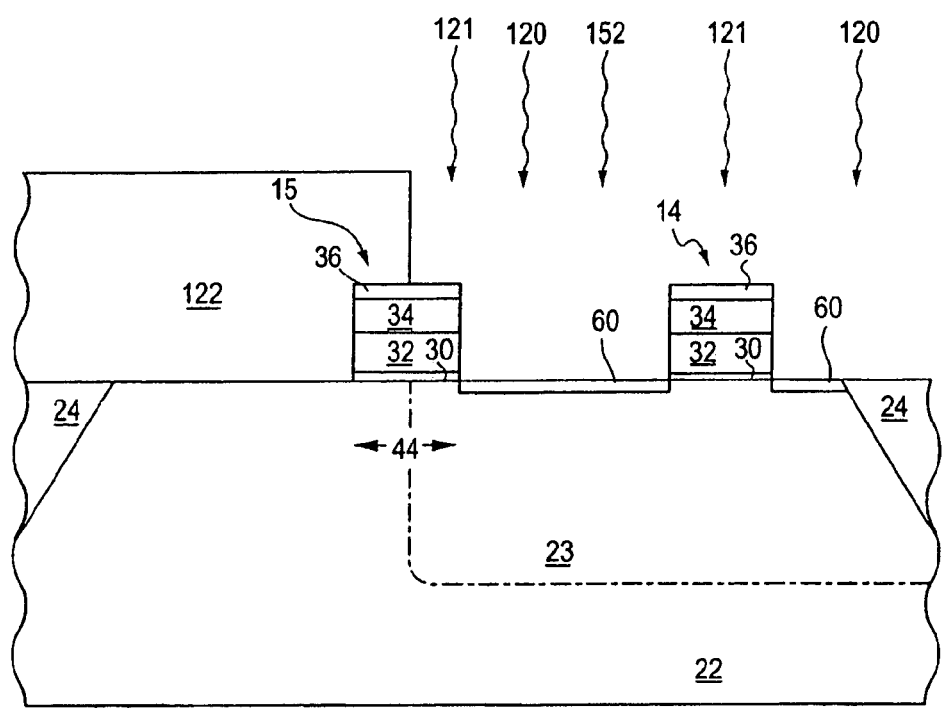
FIGS. 4(a) and 4(b) show a stage of fabrication of a pixel circuit subsequent to that shown in FIG. 3, in accordance with alternative embodiments of the invention.

Next, as shown in FIG. 4(a), transistor gates are formed, including those of the transfer transistor 15 and reset transistor 14 (of FIGS. 1(a), 1(b), and 1(c)). Standard MOS gates are formed by growing or depositing a gate oxide layer 30 (e.g., silicon oxide) over the substrate 22, depositing a polysilicon layer 32 over the gate oxide layer 30 (the polysilicon layer can be doped in situ or subsequently implanted with a dopant), optionally depositing a metal layer (e.g., tungsten, titanium, cobalt, molybdenum, tantalum, etc.) over the polysilicon layer 32, which can be subsequently thermally annealed to form a silicide layer 34, and forming an insulative cap layer 36 (e.g., oxide or nitride) over the silicide layer. There are other ways of adding a silicide layer 34, including forming the silicide (e.g., $WSi_x$, $TaSi_x$, $WN_x$/w) directly over the polysilicon layer 32. However, it should be noted that it is also possible to eliminate the silicide layer 34 from the transistor gates altogether, since doped polysilicon alone provides a suitable gate electrode. After forming the gate layers, the layers 30, 32, 34, 36 are then masked with photoresist, for example, and etched to leave stacks, which will be the transistor 14, 115 gate electrodes. Note again that the gate length 44 of the transfer transistor gate 15 can be increased as compared to the other transistor gates of the pixel 10. This increased gate length 44 assists in mitigating punch-through leakage in the device.

Figure 4B:
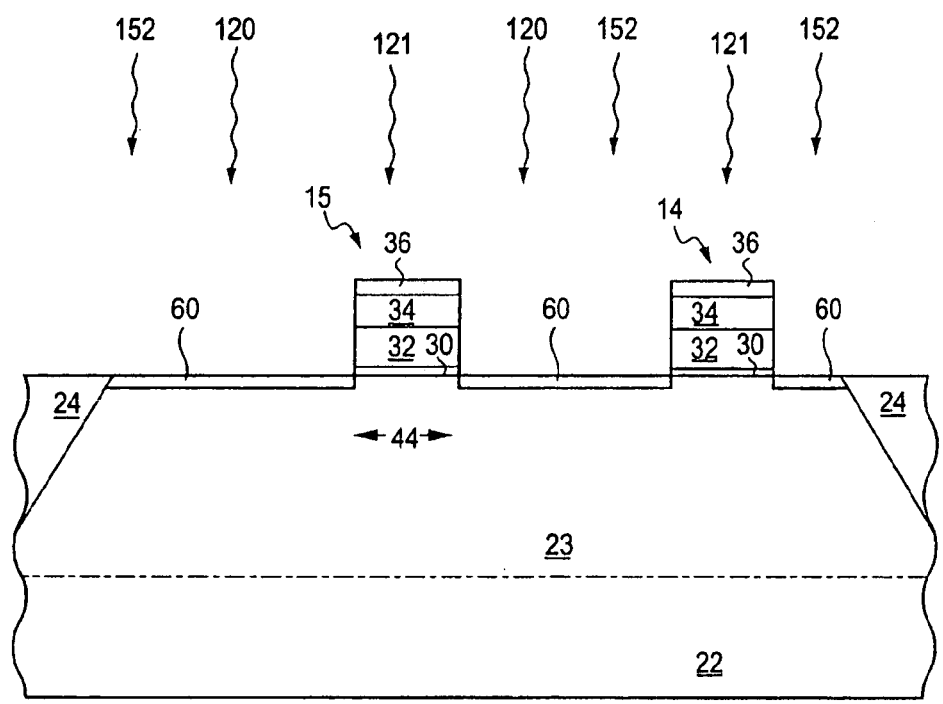

FIG. 4(a) shows a dopant implant 120, which here is p-type, into the substrate 22 to form a p-type well 23 region beneath the active area of the pixel 10. After the gate stacks are defined, a photoresist 122 is formed over the substrate 22 and patterned to partially overlap the gate stack of the transfer transistor 15. Upon performing the implant 120 of p-type ions (e.g., boron) a p-well 23 is formed. Additionally, an n-type implant 152 can optionally be performed to achieve a surface n-type layer 60. Implant 152 is phosphorus, arsenic, or antimony, at a dose of $5 \times 10^{11}$ ions/cm$^2$ to $1 \times 10^{14}$ ions/cm$^2$. Alternatively, as shown in FIG. 4(b) the dopant implant 120 to form the p-well 23 can be performed without photoresist 122 and can form a blanket p-well 23 in the substrate 22. If an n-type layer 60 is desired, it may also be achieved by a blanket implant 152 as shown in FIB. 4(b).

Also at this point in processing, as shown in FIGS. 4(a) and 4(b), a threshold voltage ($V_t$) adjustment implant 121 can be performed, particularly in the region of the substrate where the transfer transistor 15 will be formed. Note, however, that the $V_t$ adjustment implant 121 can be performed at other points in the process flow as well, as is known in the art. The $V_t$ adjustment implant 121 helps compensate for the asymmetrical active area extension region 40 to be formed later in processing and prevents charge leakage. The $V_t$ adjustment implant can be performed as disclosed in U.S. patent application Ser. No. 09/945,252 by Yang and Rhodes, the entirety of which is hereby incorporated by reference herein. The photoresist 122 is then removed.

Figure 5:
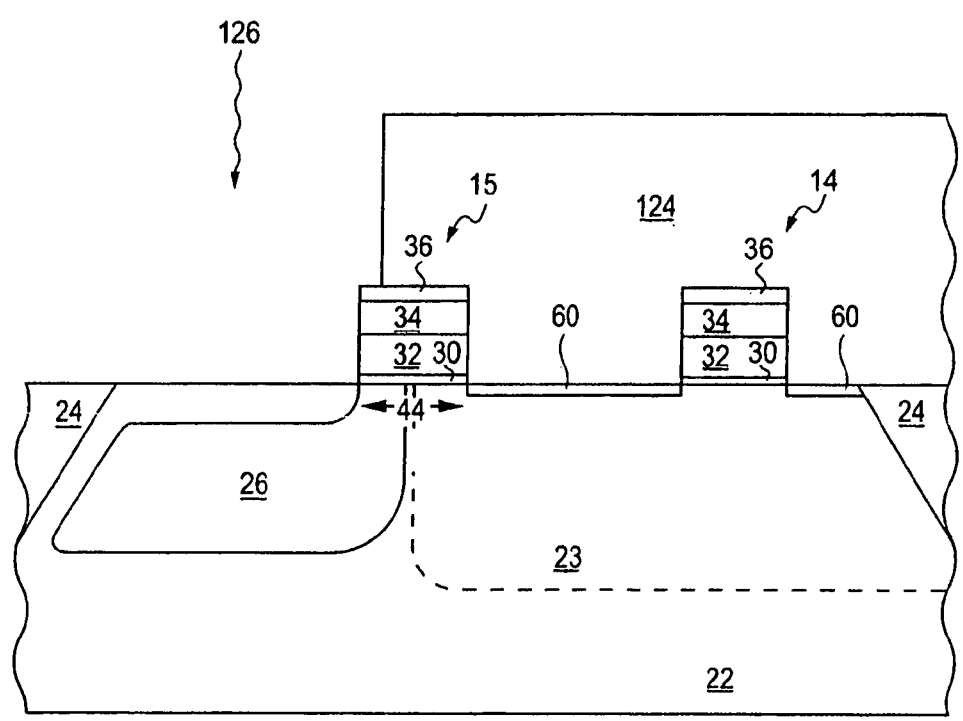
FIG. 5 shows a stage of fabrication of a pixel circuit subsequent to that shown in FIG. 4(a), in accordance with the invention.

Next, as shown in FIG. 5, the substrate 22 is masked with photoresist 124 and another ion implantation 126 of a second conductivity type, here n-type, is performed. This implant 126 can be performed by implanting appropriate n-type ions (e.g., arsenic, antimony, phosphorous, etc.) at an energy of about 10 KeV to about 500 KeV at an implant dosage of about $3\times10^{11}$ to about $1\times10^{15}$ ions/cm$^2$, preferably $1\times10^{12}$ to $1\times10^{14}$ ions/cm$^2$. This forms an n-type region 26 in the pixel's 10 active area below and adjacent to the transfer transistor 15 gate as shown. The photoresist 124 is removed.

Figure 6A:
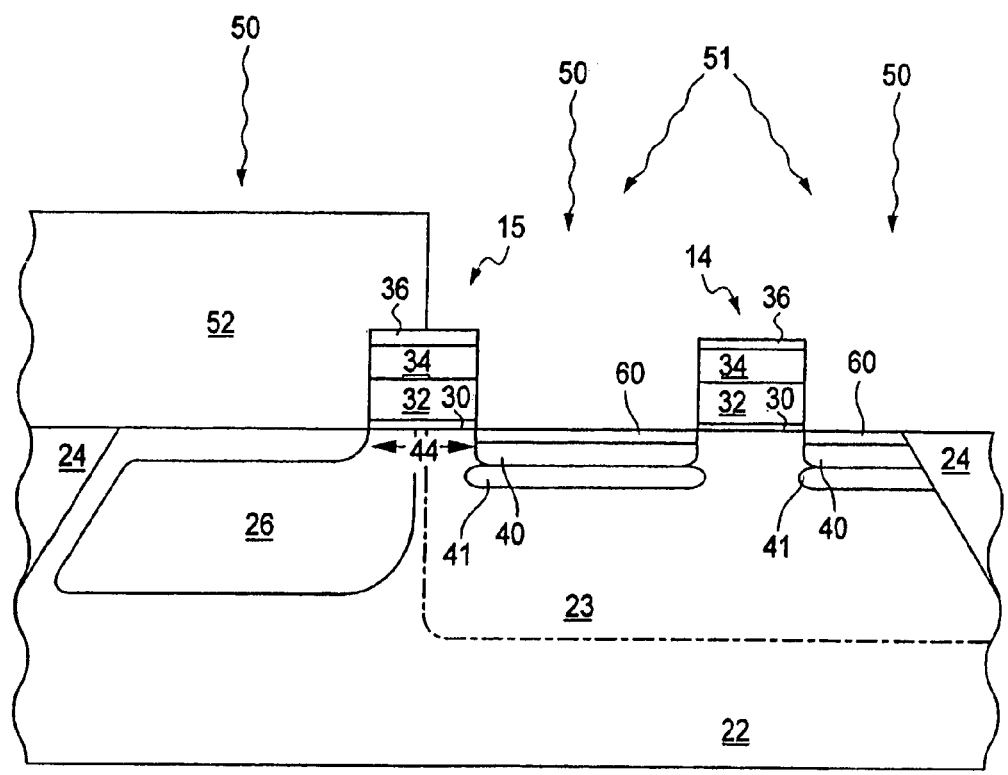
FIGS. 6(a) and 6(b) show stages of fabrication of a pixel circuit subsequent to that shown in FIG. 5, in accordance with alternative embodiments of the invention.

Active area extension regions 40 for the transistors 14, 15 are next formed. As shown in FIG. 6(a) (relating to the embodiments shown in FIGS. 1(a) and 1(b)), the substrate is masked with a photoresist 52, which partially overlies the transfer transistor 15 gate. Then, a dopant implant 50 (of, e.g., phosphorus, arsenic, or antimony ions) is performed adjacent the gate stacks of the transistors 14, 15 at doses of approximately $5\times10^{11}$ to about $1\times10^{14}$ ions/cm$^2$ and at an implantation energy in the range of about 10 KeV to about 100 KeV. The preferred dosage for the implant 50 is about $1\times10^{12}$ to about $3\times10^{13}$ ions/cm$^2$. Implantation at these energy levels results in ion distribution depths of approximately 200-1000 Å. Note that the photoresist 52 prevents the active area extension region implant 50 from penetrating the substrate 22 on the side of the transfer transistor 15 gate adjacent the photodiode 12. Since the transfer transistor 15 adjacent the photodiode 12 has an asymmetrically implanted active area extension region 40, the punch-through leakage can be adjusted for by the $V_t$ adjust implant discussed above and/or increasing the length 44 of the transfer transistor 15 gate, also discussed above. This allows the periphery transistors to be high performance, with short channel lengths since they can be symmetrical active area extension region 40 devices, but also mitigates dark current leakage at the photodiode 12 while providing punch-through protection to the associated transfer transistor 15.

After implant 50 is performed, a four-way halo implant 51 (of, e.g., boron ions) can be performed to provide added punch-through protection to the transistor gates (e.g. of the transfer transistor 15) of the pixel circuit 10. Implant 51 advantageously is four-way angled to penetrate partially below the transistor 15, 14 gates and provide halo implant regions 41 associated with the active area extension regions 40. The mask 52 is removed after the active area extension regions 40 (and optional halo implant regions 41) are formed. Optionally, this process can also include forming asymmetrical active area extension regions 40 (and halo implant regions 41) at the reset transistor 14 and source follower transistor 16 by similar masking and implanting techniques, if desired.

Figure 6B:
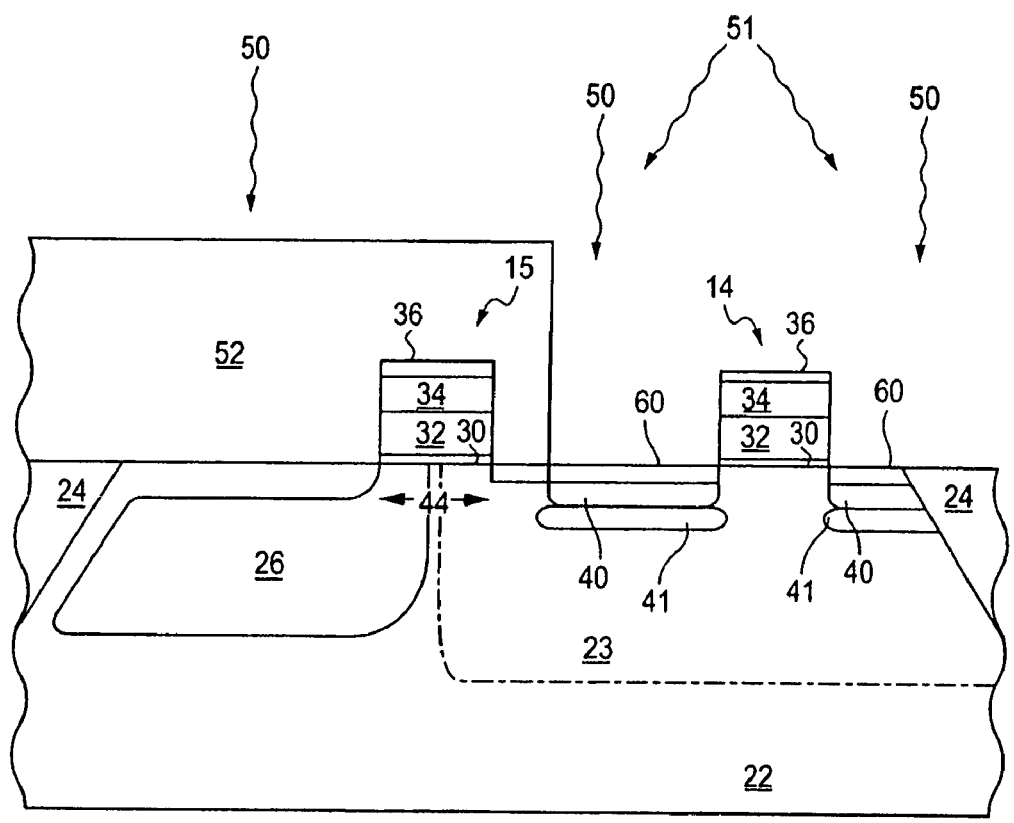

As shown in FIG. 6(b) (relating to the embodiment shown by FIG. 1(c)), the photoresist mask 52 can also be shifted to fully cover the gate of the transfer transistor 15. This shift moves the active area extension region 40 and halo implant region 41 away from the transfer transistor 15 gate in a direction towards the reset transistor 14 gate. Note that in any embodiment, the active area extension regions 41 can be formed by multiple implants, including phosphorus, arsenic, and boron ions to grade the active area extension region 40 junctions. The photoresist 52 is then removed.

Figure 7A:
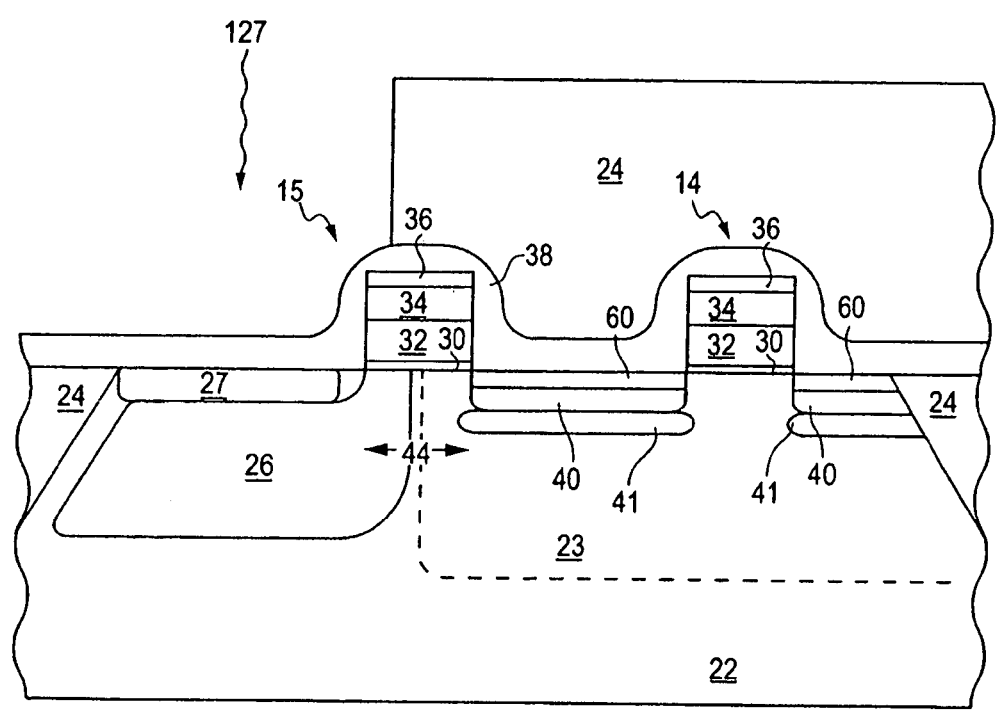
FIG. 7(a) shows a stage of fabrication of a pixel circuit subsequent to that shown in FIG. 6(a)
Figure 7B:
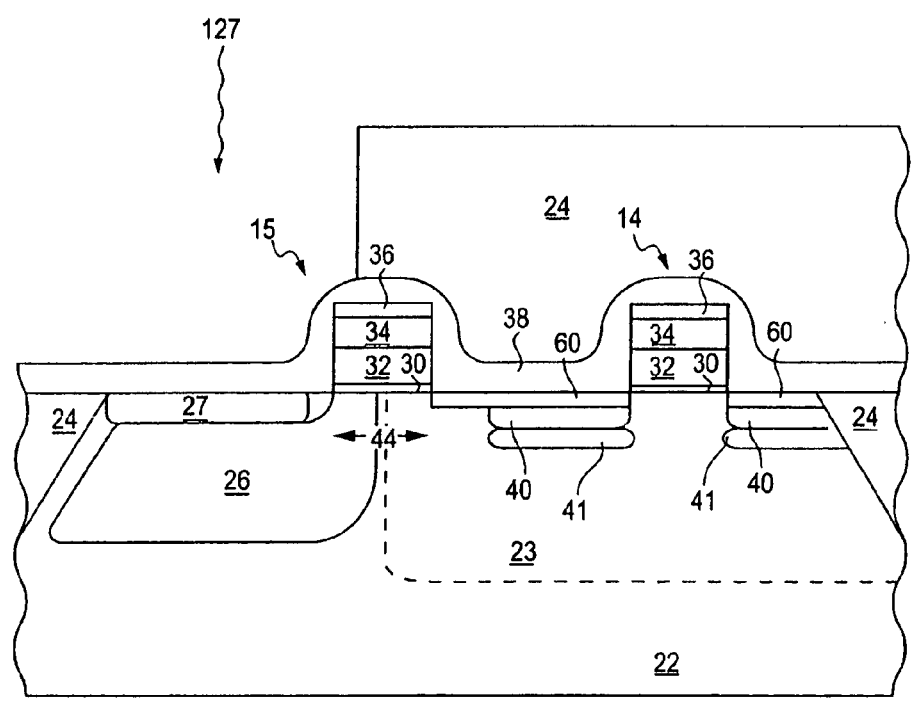
FIG. 7(b) shows a stage of fabrication subsequent to that shown in FIG. 6(b).

Continuing, as shown in FIG. 7(a) (relating to the embodiments shown in FIGS. 1(a) and 1(b)) and as shown in FIG. 7(b) (relating to the embodiment shown in FIG. 1(c)), insulating material 38 is formed over the gate stacks of the transistors 14, 15 by depositing a layer of insulating materials such as oxide or nitride. A mask of photoresist 24 is formed over the transistor 14, 15 gate stacks and the substrate 22 and patterned to expose the region of the substrate 22 over the n-type region 26 of the photodiode 12. A dopant implant 127 is performed to form a top p-type region 27 of the photodiode 12 over the n-type region 26. Optionally, an angled implant for this last implant 27 may be desired to form the top p-type layer 27 to achieve certain spatial characteristics in the doped regions of photodiode 12. The photoresist 24 is then removed. The photodiode 12 is termed a "pinned" photodiode 12 because the potential in the photodiode 12 is pinned to a constant value when it is fully depleted.

Figure 8A:
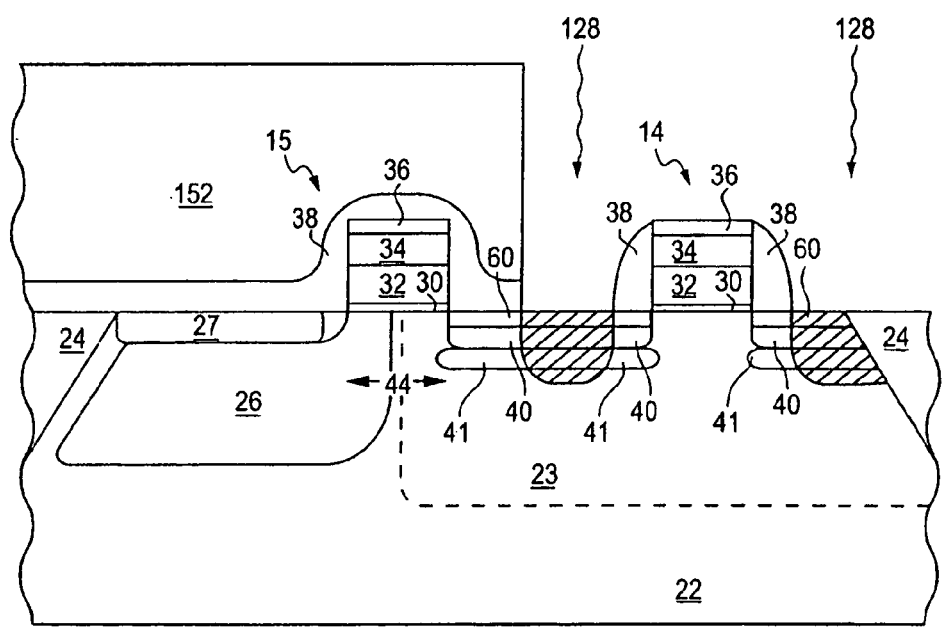
FIGS. 8(a) and 8(b) show a stage of fabrication of a pixel circuit subsequent to that shown in FIG. 7(a), in accordance with alternative embodiments of the invention.
Figure 8B:
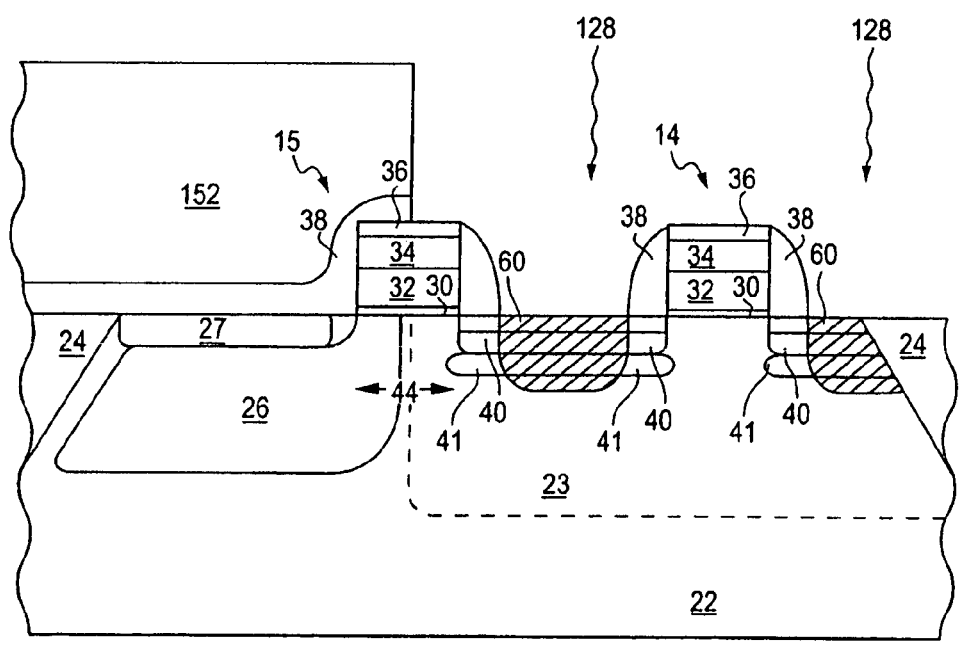
Figure 8C:
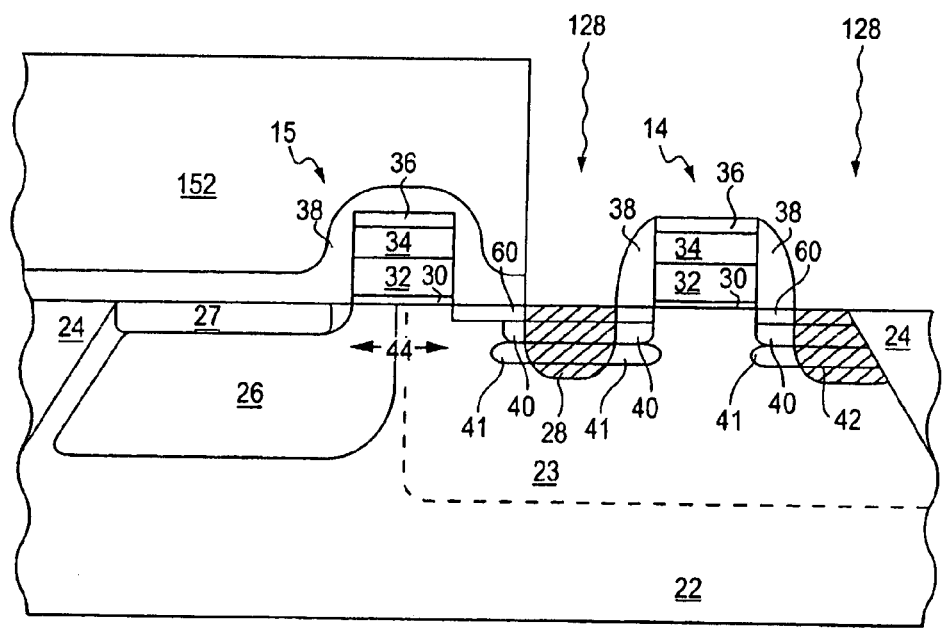
FIG. 8(c) shows a stage of fabrication subsequent to that shown in FIG. 7(b), in accordance with another embodiment of the invention.

FIGS. 8(a) and 8(b) show a stage of processing subsequent to FIG. 7(a), and FIG. 8(c) shows a stage subsequent to FIG. 7(b). As shown in FIG. 8(a) (relating to the embodiment shown in FIG. 1(a)), a mask of photoresist 152 is provided over the wafer and patterned to fully cover the transfer transistor 15 gate and define an opening over and adjacent to the reset transistor 14 gate. An etch step is performed to remove portions of the layer of insulating material 38 and to leave the material 38 as sidewall spacers on the reset transistor 14 gate. A self-aligned implant 128 of n-type dopant is performed as is known in the art to form a floating diffusion region 28 between the transfer transistor 15 and the reset transistor 14 and a source/drain region 42 on the other side of the reset transistor 14. The photoresist 152 is removed.

As shown in FIG. 8(b) (relating to the embodiment shown in FIG. 1(b)), the photoresist mask 152 is shifted over the transfer transistor 15 gate to expose one side thereof. The etching step removes the insulating material 38 and leaves a sidewall spacer on the exposed side of the transfer transistor 15 gate and on the reset transistor 14 gate. The implant 128 forms the floating diffusion region 28 and the source/drain region 42.

As shown in FIG. 8(c) (relating to the embodiment shown in FIG. 1(c)), the photoresist mask 152 is not shifted from its position shown in FIG. 8(a). The mask 152 covers a portion of the active area extension region 40 nearest the transfer transistor 15 gate. After the etch step to remove portions of the layer of insulating material 38 and define sidewall spacers of the reset transistor 14, the implant 128 forms the floating diffusion region 28 and the source/drain region 42.

In each embodiment, the floating diffusion region 28 also is an active area and acts as a type of source/drain region of the transfer transistor 15. The source/drain region 42 is electrically connected with a voltage source (Vcc) in subsequent processing to enable resetting of the pixel 10 circuit when the reset transistor 14 is "on." The floating diffusion region 28 is electrically connected with the source follower transistor 16 and through transistor 16 with the row select transistor 18 and column line 19. These electrical connections are formed by standard metallization steps through insulating layers in a manner such that the active photodiode 12 region is not obscured from receiving photo-input, as is known in the art. Thus, a transparent or translucent insulating layer, such as glass or polymer, can be deposited over the pixel imager circuit 10, which has conductive vias therein for connecting various elements of the pixel together and with row and column lines thereby substantially completing the imager device. Additional processing, such as conductive line formation to pixel 10 and associated currently, as shown in the art.

Figure 9:
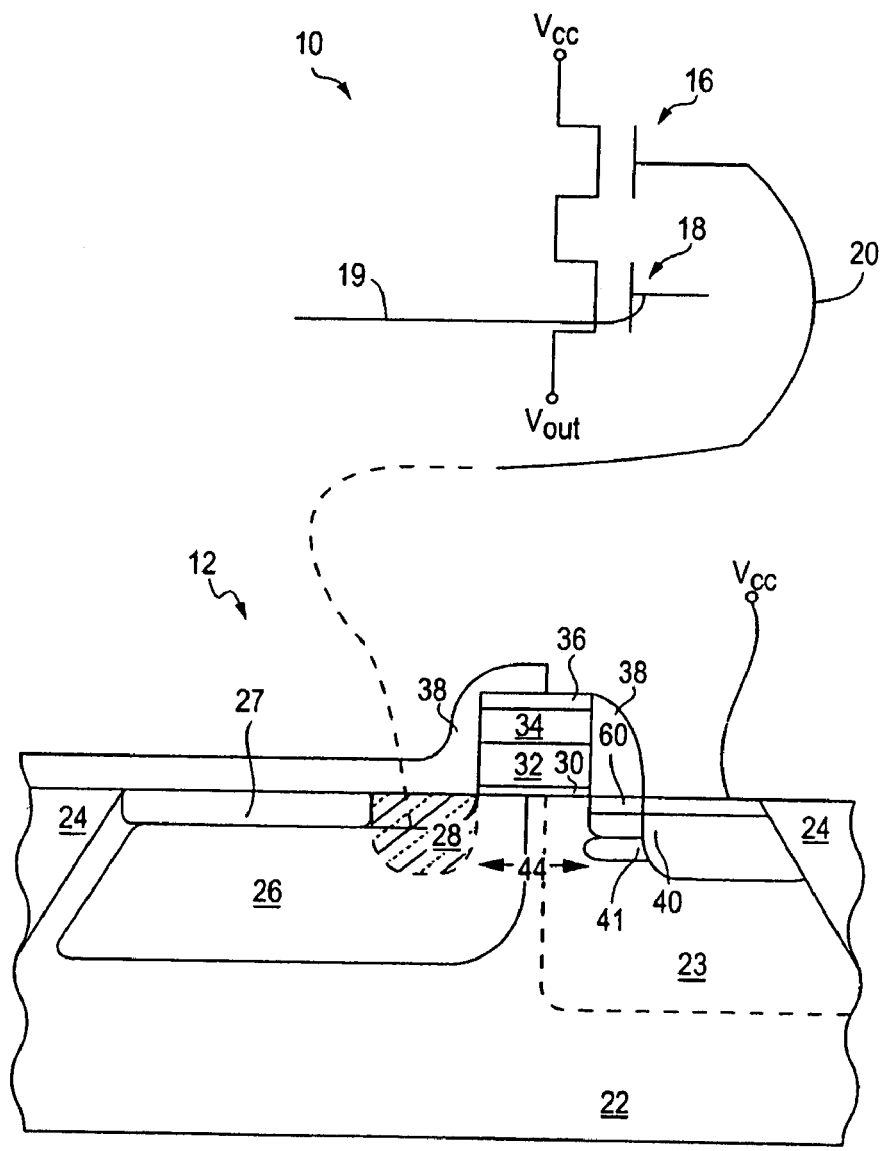
FIG. 9 is an illustration of a 3T CMOS imager circuit in accordance with the invention.
Figure 10:
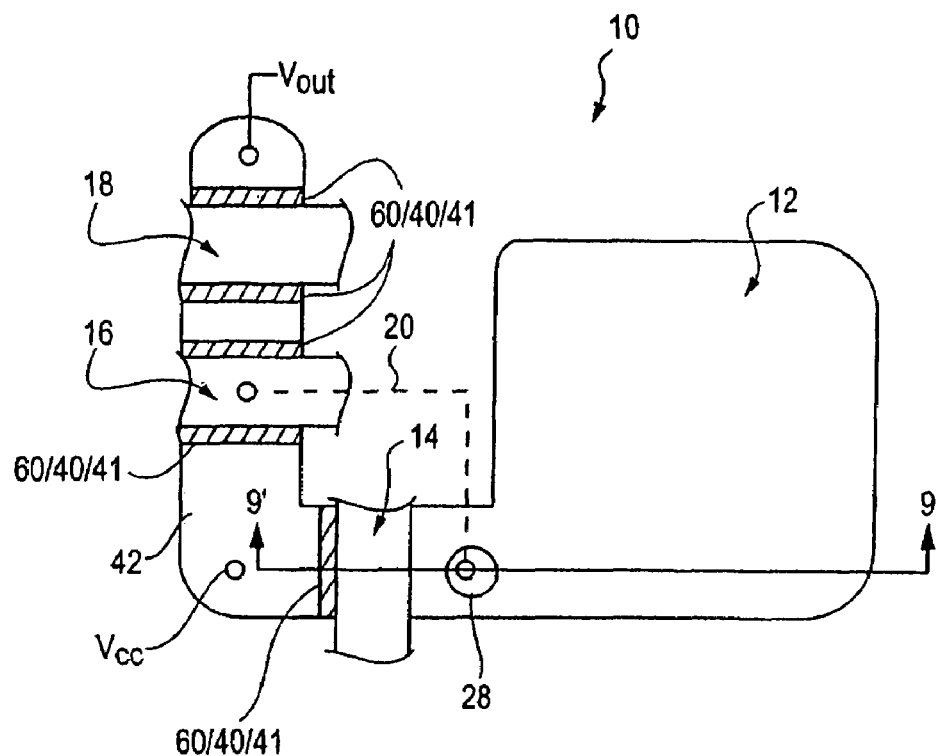
FIG. 10 shows a circuit as in FIG. 9, where the FIG. 9 cross-section is shown through line 9-9'.
Figure 10A:
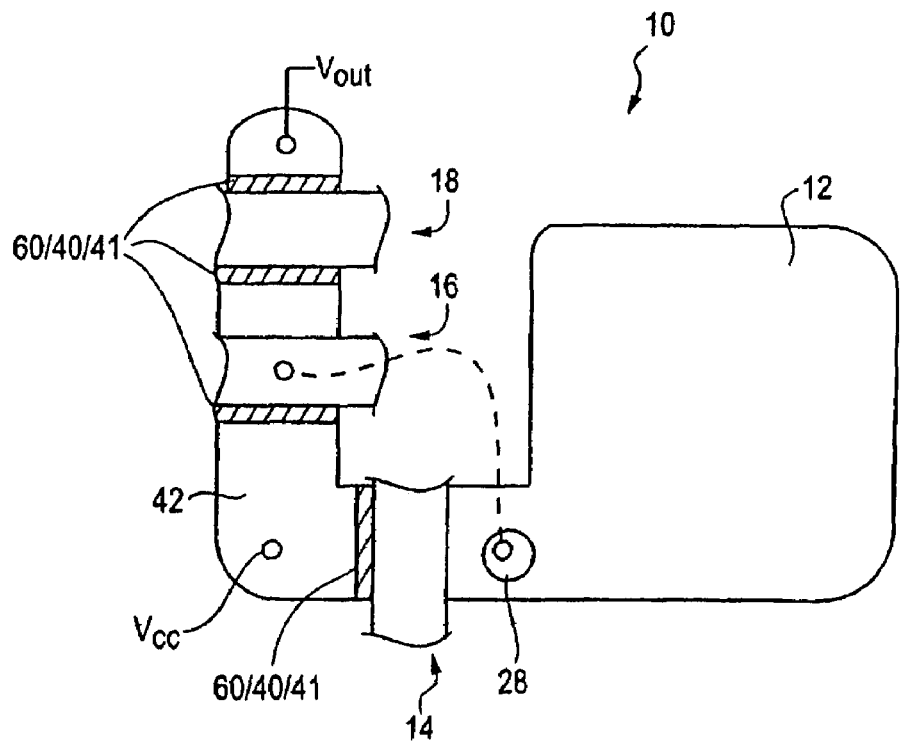
FIG. 10(a) shows an alternative embodiment to that shown in FIG. 10.

FIG. 9 and FIG. 10 show a CMOS imager circuit similar to that shown in FIG. 1(a) and FIG. 2; however, the transfer transistor 15 is omitted, making the device a three-transistor (3T) pixel 10 circuit. The processing of the 3T pixel 10 circuit is very similar to that described above for the 4T pixel, with an exception being that the reset transistor 14 now is adjacent the photodiode 12 and has the asymmetrical active area extension region 40 and halo implant region 41, increased gate length 44, and/or $V_t$ adjustment associated with the transfer transistor 15 of the 4T pixel. The interconnect 20 (not physically shown in the cross-section of FIG. 9) is linked to the photodiode 12 by the floating diffusion region 28 (an n-type region) and charges generated in the photodiode 12 are directly received by the source follower transistor 16. The reset transistor gate 14 is associated with a source/drain 42, which is in electrical contact with a voltage source ($V_{cc}$), providing device reset voltage.

FIG. 10 shows the photoconversion device of FIG. 9 from above the wafer. As shown, the layout is very similar to that shown in FIG. 2, but omits the transfer transistor 15. FIG. 10 shows a one-sided active area extension region 40 at the reset transistor 14, while the remaining transistors 16 and 18 of the pixel 10 have two-sided active area extension regions 40. Processing steps to form the 3T pixel 10 are similar to those discussed in reference to FIGS. 3-8. FIG. 10(*a*) shows an alternative embodiment where the source follower transistor 16, like the reset transistor, has a one-sided active area extension region 40.

Figure 11:
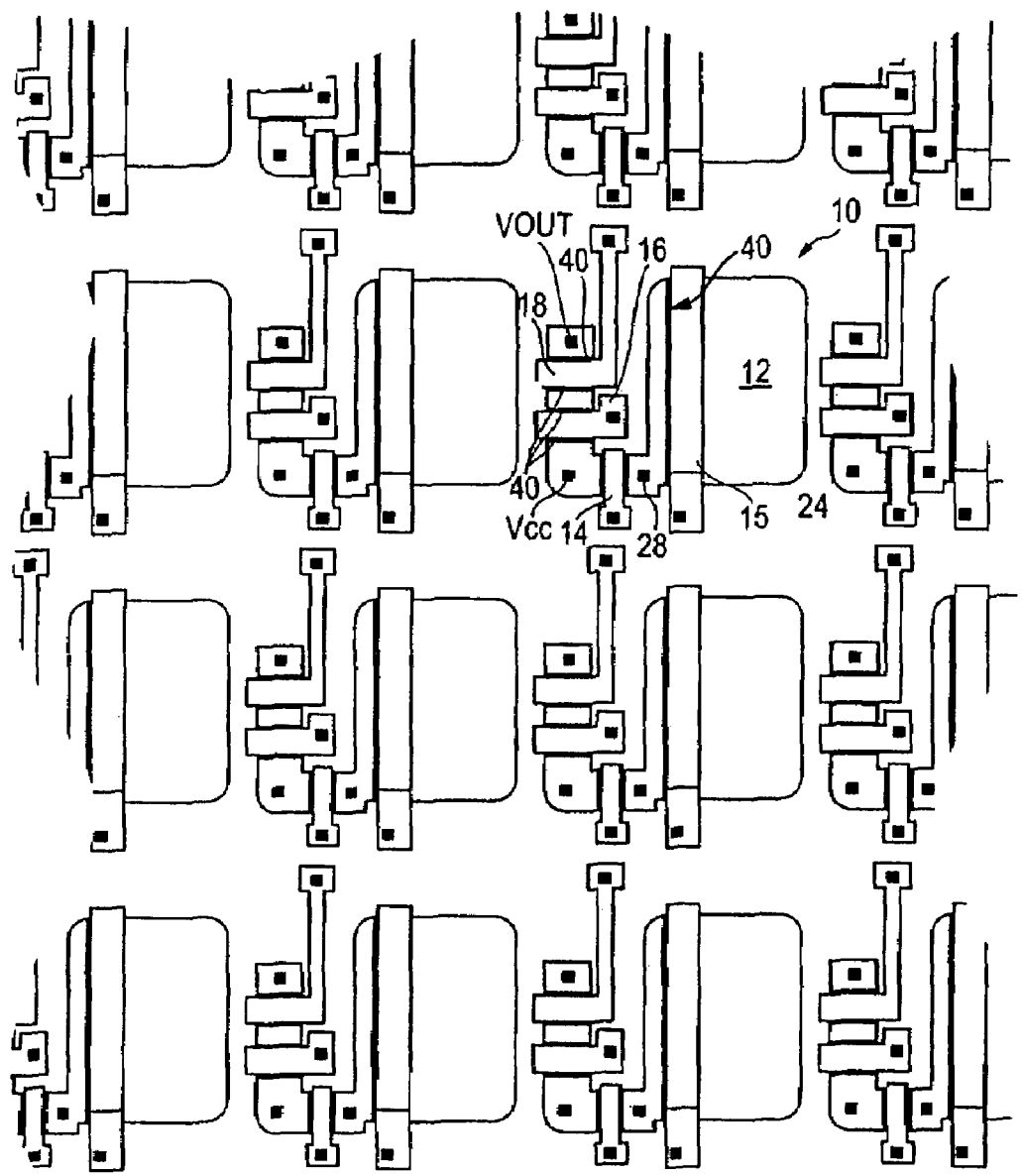
FIG. 11 shows a portion of an array of 4T CMOS imager pixels like that shown in FIG. 2, in accordance with the invention.

FIG. 11 shows part of an array 200 of 4T CMOS imager pixel 10 circuits. The asymmetrical active area extension regions 40 of the transfer transistors 15 of the pixels 10 are shown. Each pixel 10 is isolated electrically from other pixels 10 by isolation regions 24. An entire array is typically fabricated at once as discussed above in relation to FIGS. 3-8.

Figure 12:
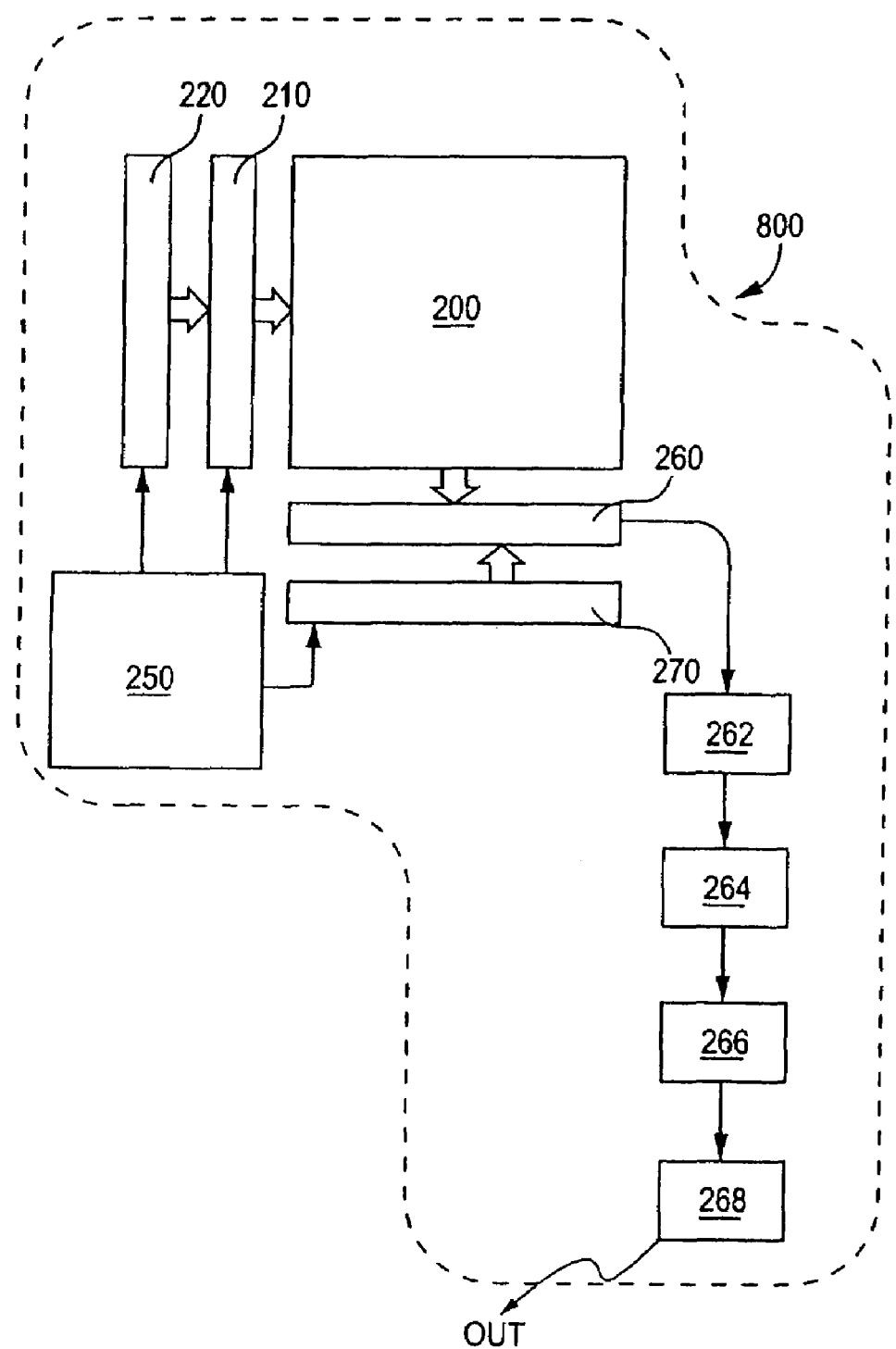
FIG. 12 shows a pixel array integrated into a CMOS imager system in accordance with the invention.

FIG. 12 illustrates a block diagram for a CMOS imager 800 having a pixel array 200 like that shown in FIG. 11, with each pixel 10 being constructed in the manner discussed above in relation to FIGS. 3-8. Pixel array 200 comprises a plurality of pixels 10 arranged in a predetermined number of columns and rows. The pixels 10 of each row in array 200 can all turned on at the same time by a row select line and the pixels 10 of each column are selectively output by a column select line. A plurality of rows and column lines are provided for the entire array 200. The row-lines are selectively activated by the row driver 210 in response to row address decoder 220 and the column select lines are selectively activated by the column driver 260 in response to column address decoder 270. Thus, a row and column address is provided for each pixel 10. The CMOS imager 800 is operated by the control circuit 250 which controls address decoders 220, 270 for selecting the appropriate row and column lines for pixel readout, and row and column driver circuitry 210, 260 which apply driving voltage to the drive transistors of the selected row and column lines. Image data is output from column select 260 to a sample-and-hold circuit 262, then to an analog-to-digital converted 264. Next, the signal can be output to a image processor 266 and then to a serializer 268. The signal can then be output to peripheral devices.

The CMOS imager of FIG. 12 can provide real-time or stored image output. Such devices can be connected to a processor based system. A typical processor-based system, which includes a CMOS imager 800 according to the present invention is illustrated generally in FIG. 13. A processor based system is exemplary of a system having digital circuits which could include CMOS imager 800 devices. Without being limiting, such a system could include a computer system, camera system, scanner, machine vision system, vehicle navigation system, video telephone, surveillance system, auto focus system, star tracker system, motion detection system, image stabilization system, medical imaging devices, and data compression system for high-definition television, all of which can utilize the present invention.

Figure 13:
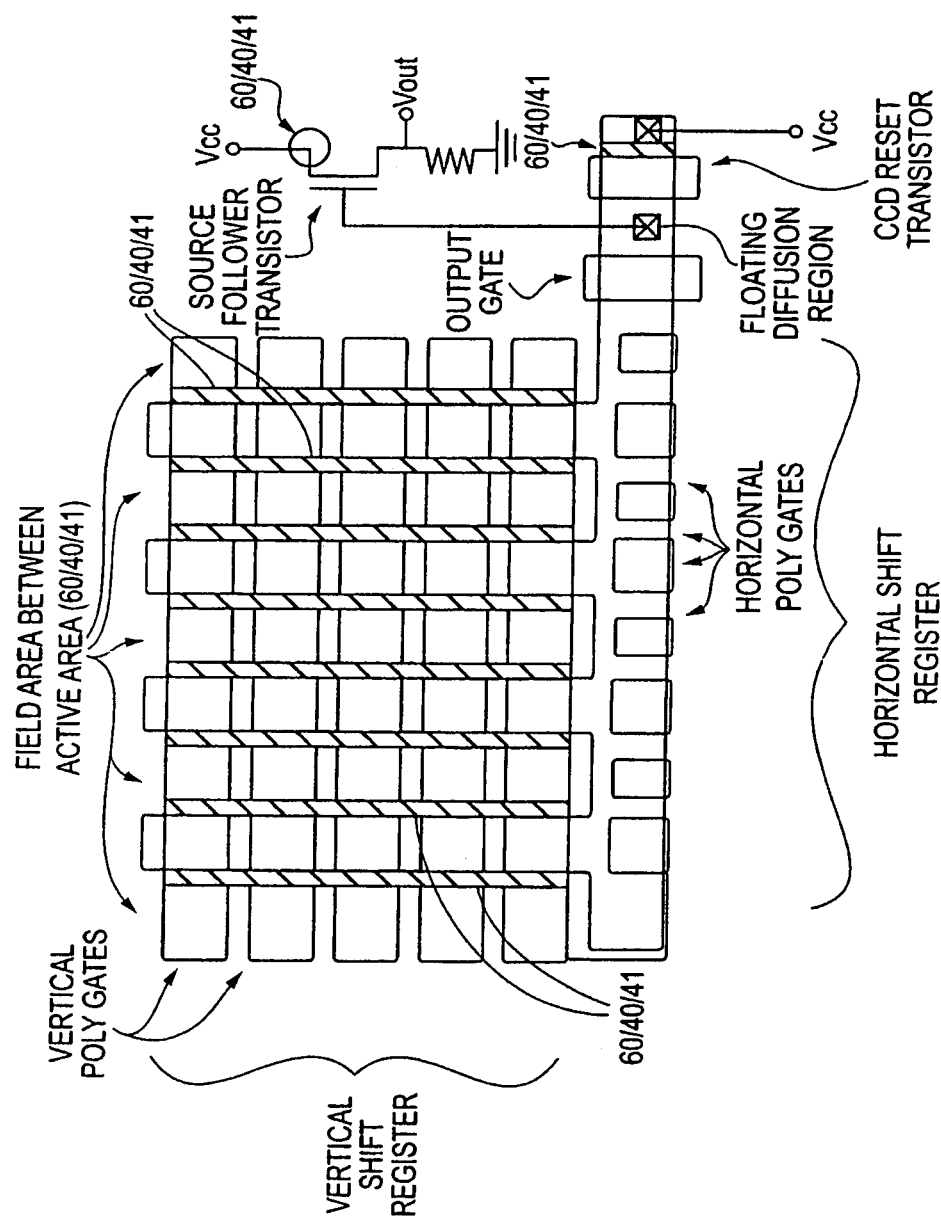
FIG. 13 shows a CCD image sensor in accordance with the invention.

FIG. 13 shows a CCD image sensor utilizing the one-sided active area extension region 40 of the invention. The CCD image sensor shown has horizontal and vertical shift registers, horizontal and vertical poly gates, and field areas between active areas, forming the image sensor region. Photocharge generated at the image sensor is output through the output gate, which is connected to other sensor circuitry, including at least a CCD reset transistor and a source follower transistor. The implanted regions 40, 41, and 60, which include a one-sided active area extension region 40, can be included at least in one or both the reset transistor and the source follower transistor. Additionally, the polysilicon gates of the image sensor can also have associated implanted regions 40, 41, and 60 adjacent the active area.

Figure 14:
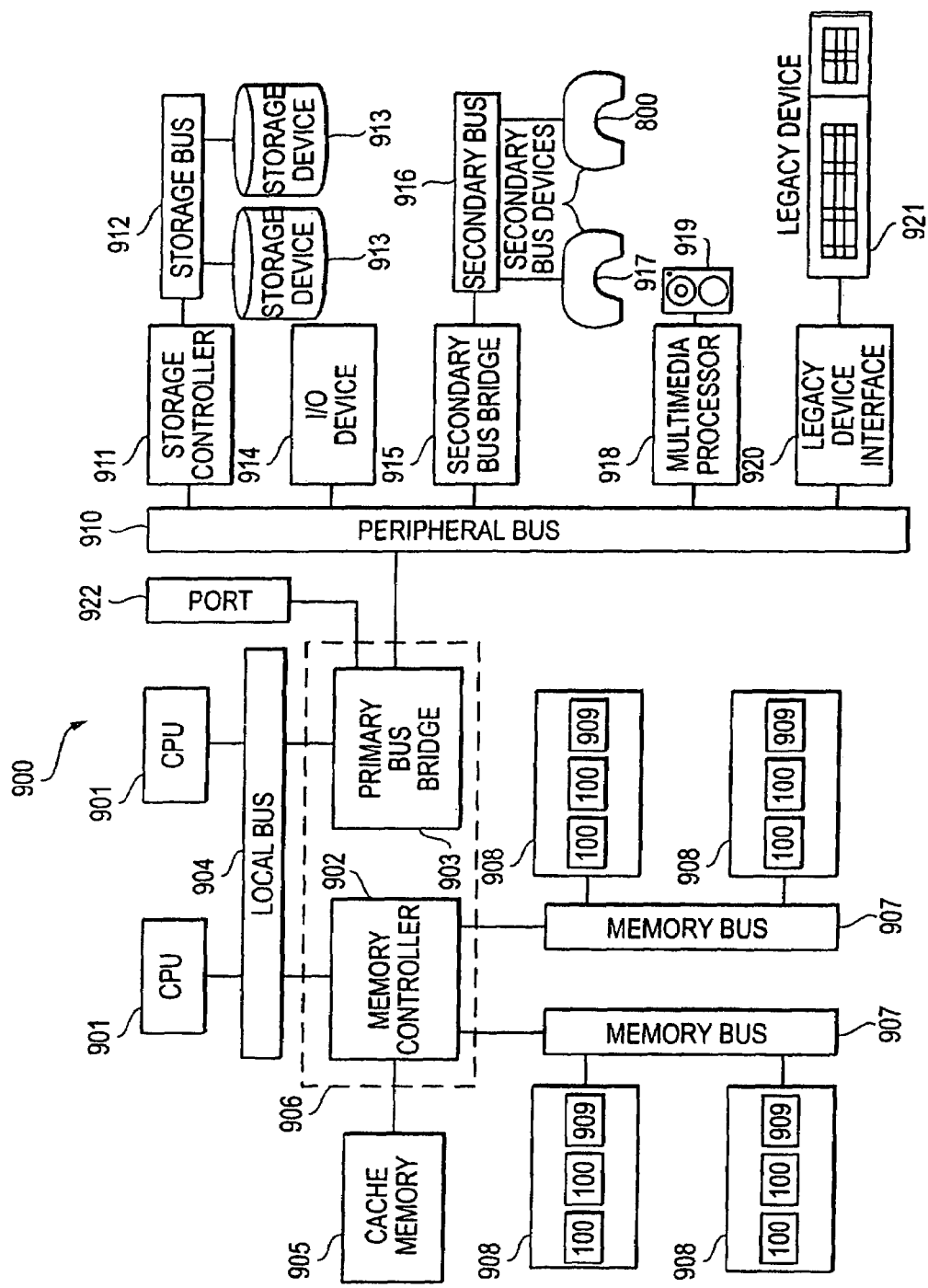
FIG. 14 shows a processor system incorporating at least one CMOS imager system, like that shown in FIG. 12, in accordance with the invention.

FIG. 14 illustrates an exemplary processor system 900, which can utilize the CMOS imager device 800 containing a pixel circuit of the present invention, as connected to a CPU 901 or memory devices 100. The system can likewise utilize a device incorporating CCD image sensors, like that shown in FIG. 13. The processor system 900 can include one or more processors 901 coupled to a local bus 904, the processor containing imager devices 800 fabricated as described above. A memory controller 902 and a primary bus bridge 903 can also be coupled the local bus 904. The processor system 900 can include multiple memory controllers 902 and/or multiple primary bus bridges 903. The memory controller 902 and the primary bus bridge 903 may be integrated as a single device 906.

The memory controller 902 can also be coupled to one or more memory buses 907. Each memory bus accepts memory components 908, which include at least one memory device 100. The memory components 908 may be a memory card or a memory module. Some examples of memory modules include single inline memory modules (SIMMs) and dual inline memory modules (DIMMs). The memory components 908 may include one or more additional devices 909. For example, in a SIMM or DIMM, the additional device 909 might be a configuration memory, such as a serial presence detect (SPD) memory. The memory controller 902 may also be coupled to a cache memory 905. The cache memory 905 may be the only cache memory in the processing system. Alternatively, other devices, for example, processors 901 may also include cache memories, which may form a cache hierarchy with cache memory 905. If the processing system 900 include peripherals or controllers which are bus masters or which support direct memory access (DMA), the memory controller 902 may implement a cache coherency protocol. If the memory controller 902 is coupled to a plurality of memory buses 907, each memory bus 907 may be operated in parallel, or different address ranges may be mapped to different memory buses 907.

The primary bus bridge 903 can be coupled to at least one peripheral bus 910. Various devices, such as peripherals or additional bus bridges may be coupled to the peripheral bus 910. These devices may include a storage controller 911, a miscellaneous I/O device 914, a secondary bus bridge 915, a multimedia processor 918, and a legacy device interface 920. The primary bus bridge 903 may also coupled to one or more special purpose high speed ports 922. In a personal computer, for example, the special purpose port might be the Accelerated Graphics Port (AGP), used to couple a high performance video card to the processing system 900.

The storage controller 911 can couple one or more storage devices 913, via a storage bus 912, to the peripheral bus 910. For example, the storage controller 911 may be a SCSI controller and storage devices 913 may be SCSI discs. The I/O device 914 may be any sort of peripheral. For example, the I/O device 914 may be a local area network interface, such as an Ethernet card. The secondary bus bridge may be used to interface additional devices via another bus to the processing system. For example, the secondary bus bridge may be an universal serial port (USB) controller used to couple USB devices 917, including the CMOS imager 800 device, via to the processing system 900. The multimedia processor 918 may be a sound card, a video capture card, or any other type of media interface, which may also be coupled to one additional devices such as speakers 919. The legacy device interface 920 can be used to couple legacy devices; for example, older styled keyboards and mice, to the processing system 900.

The processing system 900 illustrated in FIG. 14 is only an exemplary processing system with which the invention may be used. While FIG. 14 illustrates a processing architecture especially suitable for a general purpose computer, such as a personal computer or a workstation, it should be recognized that well known modifications can be made to configure the processing system 900 to become more suitable for use in a variety of applications. For example, many electronic devices, which require processing may be implemented using a simpler architecture, which relies on a CPU 901, coupled to memory components 908 and/or memory devices 100. These electronic devices may include, but are not limited to audio/video processors and recorders, gaming consoles, digital television sets, wired or wireless telephones, navigation devices (including system based on the global positioning system (GPS) and/or inertial navigation), and digital cameras and/or recorders. The modifications may include, for example, elimination of unnecessary components, addition of specialized devices or circuits, and/or integration of a plurality of devices.

The above-described embodiments are n-channel devices, such as the n-channel reset transistor 14. However, it should be understood that the invention is not limited to such conductivity types. Accordingly, the invention is also applicable to p-channel devices formed within an n-type substrate 22. In such an embodiment the conductivity types of all structures changes accordingly, with the reset transistor 14 corresponding to a PMOS transistor.

The processes and devices described above illustrate preferred methods and typical devices of many that could be used and produced. The above description and drawings illustrate embodiments, which achieve the objects, features, and advantages of the present invention. However, it is not intended that the present invention be strictly limited to the above-described and illustrated embodiments. Any modifications, though presently unforeseeable, of the present invention that comes within the spirit and scope of the following claims should be considered part of the present invention.

What is claimed as new and desired to be protected by Letters Patent of the United States is:

1. A method of forming a pixel of an imager device, comprising:
    forming a photoconversion device in a substrate;
    forming a first transistor gate stack over said substrate adjacent said photoconversion device at a first side of said first transistor gate stack;
    forming a second transistor gate stack over said substrate on a second side of said first transistor gate stack;
    forming a single active area extension region in said substrate on the second side of said first transistor gate stack, wherein there is no other active area extension region adjacent said first transistor gate stack; and
    forming a floating diffusion region in said substrate and on the second side of said first transistor gate stack, wherein said floating diffusion region is closer to said second transistor gate stack than said first transistor gate stack.

2. The method of claim 1, wherein said photoconversion device is a photodiode.

3. The method of claim 2, wherein said forming said single active area extension region comprises a self-aligned dopant implant utilizing said first transistor gate stack for alignment and a mask for preventing implantation of said dopant on said first side of said first transistor gate stack.

4. The method of claim 3, wherein said mask partially exposes said first transistor gate stack at said second side.

5. The method of claim 1, wherein said floating diffusion region is separated from said first transistor gate stack by said active area extension region.

6. The method of claim 1, wherein said floating diffusion region and said active area extension region are laterally spaced away from said first transistor gate stack by a portion of said substrate.

7. The method of claim 1, further comprising performing a threshold voltage adjustment implant in said substrate under said first transistor gate stack.

8. The method of claim 1, wherein said first transistor gate stack has a gate length that is increased relative to other transistors of the same said pixel.

9. The method of claim 1, wherein said forming a single active area extension region comprises implanting a dopant at a concentration of about $1\times10^{12}$ to about $3\times10^{13}$ ions/cm$^2$.

10. The method of claim 1, further comprising forming a halo implant region below said active area extension region.

11. The method of claim 1, further comprising forming a reset transistor, a source follower transistor, and a row select transistor in the same circuit as said photodiode and said first transistor gate.

12. The method of claim 11, further comprising forming a single active area extension region at each of said reset transistor and said source follower transistor.

13. A method of forming an array of pixels isolated from one another within and on a substrate, comprising:
    forming a photodiode within said substrate;
    forming a transfer transistor gate over said substrate and in electrical communication with said photodiode;
    forming a reset transistor gate over said substrate and spaced apart from said transfer transistor gate;
    implanting a first dopant to form active area extension regions in said substrate on both sides of said reset transistor gate and on one side of said transfer transistor gate opposite from said photodiode;
    implanting a second dopant to form halo implant regions below said active area extension regions;
    forming an insulating layer over said transfer transistor gate and said reset transistor gate at least over said active area extension regions; and
    implanting a third dopant in said substrate to form a floating diffusion region between said transfer transistor gate and said reset transistor gate and a source/drain region adjacent to a side of reset transistor gate opposite said floating diffusion region, wherein said floating diffusion region is closer to said reset transistor gate than said transfer transistor gate.

14. The method of claim 13, wherein said insulating layer covers said transfer transistor gate, said photodiode, and sides of said reset transistor gate.

15. The method of claim 14, wherein said active area extension region on one side of said transfer transistor gate and said floating diffusion region are laterally spaced away from said transfer transistor gate toward said reset transistor gate by a portion of said substrate.

16. The method of claim 13, further comprising performing a threshold voltage adjustment implant for said transfer transistor gate.

17. The method of claim 13, wherein said transfer transistor gate is formed having a gate length which is increased relative to other transistors of said pixel.

18. A method of forming an imager pixel with mitigated dark current leakage, comprising:
    forming a first transistor adjacent a photodiode at a first side of said first transistor, said first transistor having a single active area extension region at a second side of said first transistor opposite said first side; and
    forming a floating diffusion region on said second side of said first transistor and in said substrate, wherein said floating diffusion region and said single active area extension region are laterally spaced away from a gate of said first transistor by a portion of said substrate.

19. The method of claim 18, further comprising forming a second transistor on the other side of said floating diffusion region from said first transistor.

20. The method of claim 19, wherein said floating diffusion region is closer to a gate of said second transistor that the gate of said first transistor.

21. The method of claim 18, wherein said first transistor has an increased gate length relative to any other transistor gate said imager pixel.

22. The method of claim 18, further comprising providing a threshold voltage adjustment implant below said first transistor.

23. A method of forming an imager pixel with mitigated leakage and dark current, comprising:
    forming a first transistor gate adjacent a photodiode at a first side of said first transistor, said first transistor having a gate and a single active area extension region at a second side of said first transistor gate opposite said first side and a threshold voltage adjustment implant below said transistor;
    forming a second transistor having a gate on the second side of said first transistor;
    forming a floating diffusion region between the first and second transistor gates and closer to said second transistor gate.

24. The method of claim 23, wherein said transistor has an increased gate length relative to any other transistor gate said imager pixel.

25. A method of forming an imager pixel with mitigated leakage and dark current, comprising forming a transfer transistor gate adjacent a photodiode at a first side of said transfer transistor gate, said transfer transistor gate having an associated single active area extension region at a second side of said transfer transistor gate opposite said first side, wherein said transfer transistor gate has an increased gate length relative to any other transistor gate of said imager pixel and said active area extension region is laterally spaced away from said transfer transistor gate.

26. The method of claim 25, further comprising providing a threshold voltage adjustment implant below said transistor.

27. A method of forming an imager pixel with mitigated leakage and dark current, comprising forming a transistor adjacent a photodiode at a first side of said transistor, said transistor having an active area and a single active area extension region at a second side of said transistor opposite said first side, where said active area and said active area extension region are laterally spaced away from a gate of said transistor by a portion of a substrate supporting said transistor.

28. The method of claim 27, where said transistor has an increased gate length relative to any other transistor gate said imager pixel.

29. The method of claim 27, further comprising providing a threshold voltage adjustment implant below said transistor.

* * * * *